(12) United States Patent
Li et al.

(10) Patent No.: US 12,160,223 B1
(45) Date of Patent: Dec. 3, 2024

(54) TUNING FORK CRYSTAL OSCILLATOR PLATE AND MANUFACTURING METHOD THEREFOR, AND PIEZOELECTRIC DEVICE

(71) Applicant: Chengdu Taimeike Crystal Technology Co., Ltd, Sichuan (CN)

(72) Inventors: Hui Li, Sichuan (CN); Rongguo Chen, Sichuan (CN); Zhuzhi Ye, Sichuan (CN)

(73) Assignee: Chengdu Taimeike Crystal Technology Co., Ltd, Sichuan (CN)

( * ) Notice: Subject to any disclaimer, the term of this patent is extended or adjusted under 35 U.S.C. 154(b) by 0 days.

(21) Appl. No.: 18/514,751

(22) Filed: Nov. 20, 2023

(51) Int. Cl.
*H03H 9/21* (2006.01)
*H03H 3/02* (2006.01)
*H03H 9/215* (2006.01)

(52) U.S. Cl.
CPC .............. *H03H 9/215* (2013.01); *H03H 3/02* (2013.01); *H03H 2003/026* (2013.01); *H03H 9/21* (2013.01)

(58) Field of Classification Search
CPC .................................. H03H 9/215; H03H 9/21
See application file for complete search history.

(56) References Cited

U.S. PATENT DOCUMENTS

| 2011/0163063 | A1* | 7/2011 | Katoh | G01C 19/5628 216/13 |
| 2012/0007685 | A1* | 1/2012 | Yamada | H03H 9/0519 331/156 |
| 2012/0194285 | A1* | 8/2012 | Yamazaki | H03H 9/215 310/366 |
| 2013/0119823 | A1* | 5/2013 | Ichikawa | H03H 9/19 310/312 |
| 2014/0253254 | A1* | 9/2014 | Yamada | H03H 9/1021 310/370 |

FOREIGN PATENT DOCUMENTS

JP     2004200915 A     7/2004

* cited by examiner

*Primary Examiner* — Bryan P Gordon (57) ABSTRACT

The present invention provides a tuning fork crystal oscillator plate and a manufacturing method therefor, and a piezoelectric device. The tuning fork crystal oscillator plate has a base and a pair of vibrating arms extending out of the base, wherein a front surface and a back surface of each vibrating arm are separately provided with step-shaped sinking grooves formed by photolithography and corrosion along a thickness direction, and the photolithography and corrosion are performed on the step-shaped sinking grooves along a length direction of the vibrating arms; the step-shaped sinking groove is provided with n steps; and outer surfaces of the step-shaped sinking groove are all plated with electrodes. The piezoelectric oscillator plate manufactured by the present invention has the advantages of low impedance, high frequency precision and low energy consumption.

8 Claims, 10 Drawing Sheets

TUNING FORK CRYSTAL OSCILLATOR PLATE AND MANUFACTURING METHOD THEREFOR, AND PIEZOELECTRIC DEVICE

TECHNICAL FIELD

The present invention relates to the field of piezoelectric devices, and specifically, to a tuning fork crystal oscillator plate and a manufacturing method therefor, and a piezoelectric device.

BACKGROUND

A quartz tuning fork crystal resonator is an electronic component that uses the inverse piezoelectric effect of a piezoelectric quartz crystal to generate high-precision oscillation frequency under the drive of an electric field. The quartz tuning fork crystal resonator is mainly composed of a tuning fork crystal oscillator plate, a base, a shell, a silver colloid and other components. The frequency of a tuning fork applied to the current electronic information is 32.768 KHz, and a standard pulse per second signal is generated after 15 times of frequency division, so that the tuning fork is used for electronic system clock timing and is an important clock unit module of an electronic system. The quartz tuning fork crystal resonator is widely applied to mobile phones, computers, wireless earphones, smart bands, intelligent household appliances, health medical devices, watches and clocks. With the miniaturization and ultra-thinness of communication terminal electronic products, especially smart wearable electronic products that have strict requirements on circuit installation space, electronic devices also require small size and miniaturization. As a tuning fork type quartz crystal resonator that generates clock signals in electronic products, the package size is also gradually reduced, which means that the tuning fork crystal oscillator plate in the quartz crystal resonator is also getting smaller and smaller in size.

In designing a small tuning fork type oscillator, in order to accommodate the oscillator in a package base, a size reduction is required. A form in which a groove is formed in a vibrating arm is currently used, such as a structure shown in FIG. 1, in which an electrode is formed in the groove to increase an electrode area, improve an electric field efficiency, and thereby reduce a resistance value. Meanwhile, with the miniaturized tuning fork crystal resonators decreasing in size, conventional mechanical processing cannot meet the requirements. Currently, the quartz tuning fork oscillator, which is a core component of miniaturized SMD tuning fork crystal resonators, is processed using photolithography and corrosion processes (an etching process for short).

Figure 2:
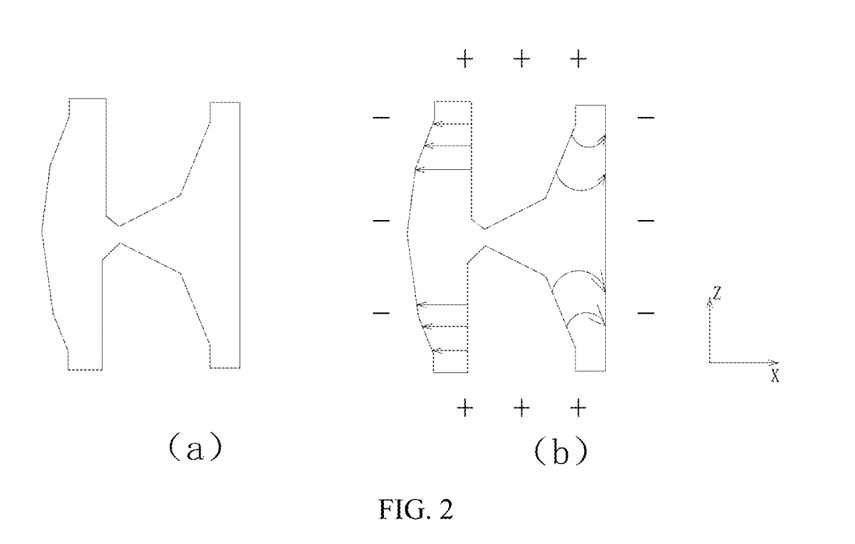
FIG. 2 is a schematic diagram of a cross-sectional structure and an electric field of a vibrating arm of a tuning fork crystal oscillator plate after corrosion in the conventional technology.
Figure 3:
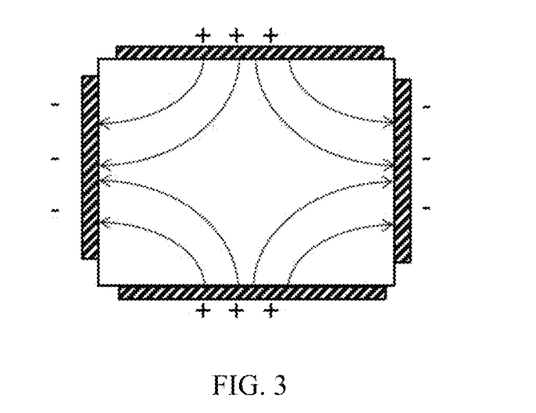
FIG. 3 is a schematic diagram of an electric field distribution of a non-grooved vibrating arm in the conventional technology.
Figure 4:
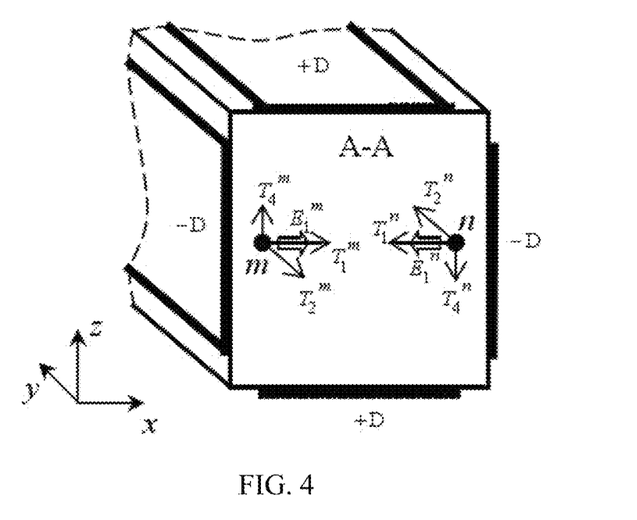
FIG. 4 is a stress analysis diagram of the vibrating arm in FIG. 3.
Figure 5:
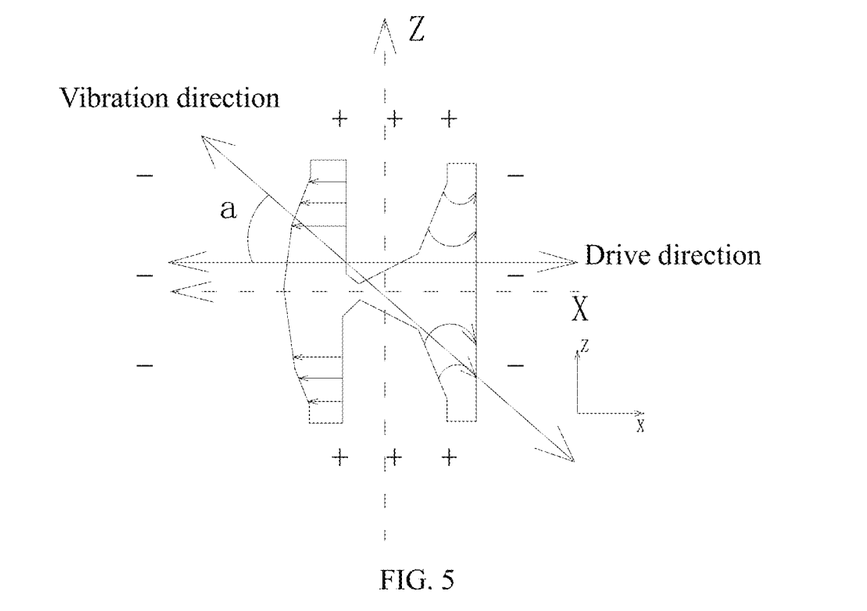
FIG. 5 is an analysis diagram of the electric field drive and vibration direction of the vibrating arm of the structure shown in FIG. 2.
Figure 6:
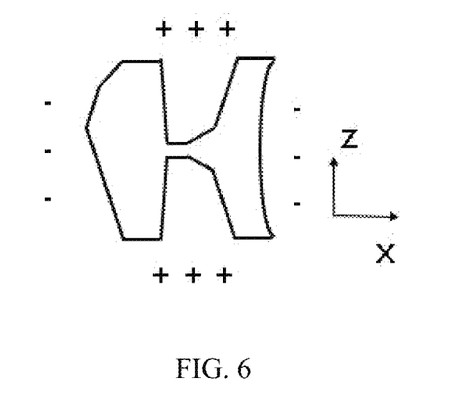
FIG. 6 is a schematic diagram of the stretching vibration in the X direction of the structure shown in FIG. 2.
Figure 7:
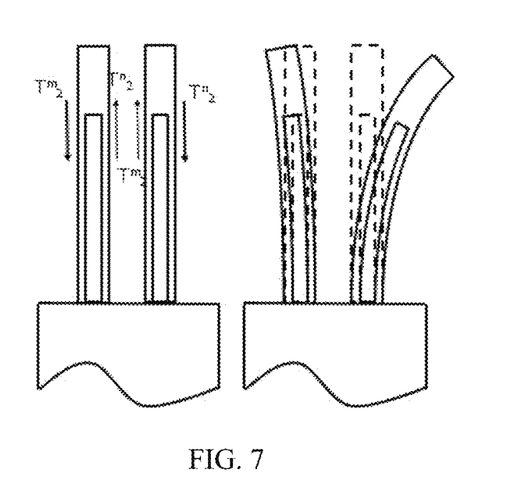
FIG. 7 is a schematic diagram of the force analysis and vibration of the structure shown in FIG. 2.

Since the piezoelectric quartz crystal is made of anisotropic materials, the corrosion rate of the quartz crystal is different along different axial directions of the quartz crystal in the etching process, consequently, the corrosion section diagram of the groove on the tuning fork arm is shown in FIG. 2(a); the electric field distribution and vibration analysis of the quartz crystal in the case shown in FIG. 2(a) are shown in FIG. 2(b). Electrodes need to be plated on four sides of a tuning fork vibrating arm in the conventional design, where positive electric fields are applied to an upper surface electrode and a lower surface electrode, negative electric fields are applied to side surface electrodes, and the electric field distribution is shown in FIG. 3. The force analysis of the tuning fork vibrating arm is shown in FIG. 4; as shown in FIG. 4, T1 represents a force in the X direction, T2 represents a force in the Y direction, and T4 represents a shear force in the XZ direction. Since the piezoelectric coefficients d11 and d12 of T1 and T2 generated by a Z-cut quartz crystal are 2.31e-12 N/C, the piezoelectric coefficient d14 corresponding to the generated stress T4 is 7.30e-13 N/C, and the force on T4 is very small and is often ignored. It can be seen from the force analysis in FIG. 4 that a direction of the force T1 is opposite to the X direction, and no deformation occurs when the moment is 0; the force T4 in the Z direction is balanced but the moment is not 0, and torsional deformation can be generated; the force T2 in the Y direction is balanced, the moment is not 0, and the unbalanced moment causes bending, and therefore bending deformation occurs in the X direction under the action of the electric field μl. Based on the force analysis principle of FIG. 4, a force analysis is performed on FIG. 2 as shown in FIG. 5. As shown in FIG. 5, Tm1 and Tn1 are no longer symmetrical in force, stretching vibration along the X direction occurs, as shown in FIG. 6, the single arms Tm2 and Tn2 are asymmetrical in force, bending vibration along the Y direction occurs, and in addition, the whole tuning fork vibrating arm not only bends along the X direction but also generates a torsion component along the Z direction. In addition, due to the corrosion symmetry of two tuning fork vibrating arms shown in FIG. 2, Tm2 is greater than Tn2 under the action of the electric field μl in the X direction due to the asymmetric stress shown in FIG. 7, Tm2 causes the side surface of a vibrating arm to compress, and Tn2 causes s side surface of the vibrating arm to stretch, so that the two tuning fork vibrating arms are asymmetrically bent, as shown in FIG. 7. As a result, the vibration impedance of the whole tuning fork is too large, and the Q value of the piezoelectric device is affected by the too large impedance; consequently, the frequency precision is affected and the energy consumption is increased.

The applicant found that the conventional technology has at least the following technical problems:

A tuning fork crystal oscillator plate in the conventional technology has the defect of high impedance, and the Q value of a piezoelectric device is affected by too large impedance; consequently, the precision of frequency is affected and the energy consumption is increased.

SUMMARY

The present invention aims to provide a tuning fork crystal oscillator plate and a manufacturing method therefor, and a piezoelectric device, so as solve the technical problems that the tuning fork crystal oscillator plate in the conventional technology has the defect of high impedance, and the Q value of a piezoelectric device is affected by too large impedance; consequently, the precision of frequency is affected and the energy consumption is increased. The many technical effects that can be produced by the preferred technical solution of the technical solutions provided by the present invention are described in detail in the following.

In order to achieve the above objective, the present invention provides the following technical solutions.

A tuning fork crystal oscillator plate provided by the present invention has a base and a pair of vibrating arms extending out of the base, wherein a front surface and a back surface of each vibrating arm are separately provided with step-shaped sinking grooves formed by photolithography and corrosion along a thickness direction, and the photolithography and corrosion are performed on the step-shaped sinking grooves along a length direction of the vibrating arms;

the step-shaped sinking groove is provided with n steps, and the n steps are formed by n times of photolithography and corrosion, where n is a natural number and is greater than or equal to 2; and outer surfaces of the step-shaped sinking groove are all plated with electrodes.

Further, the step-shaped sinking groove comprises a middle step and at least one group of edge steps; the number of the middle steps is one, the number of the edge steps is n−1 groups, and each group of the edge steps are two same steps that are symmetrically arranged on two sides of the middle step.

Further, the step-shaped sinking groove has one group of edge steps, two groups of edge steps, or three groups of edge steps.

Further, when one group of edge steps are provided, a width W1 of any one of the edge steps is 5%-40% of a total width W of the steps; a ratio of a height H1 of any one of the edge steps to a height H2 of the middle step is 1:1-1:3; the total width of the steps is a sum of widths of all the edge steps and a width of the middle step;

when two groups of edge steps are provided, widths of the two groups of edge steps are the same, and a sum of widths of two edge steps on the same side is 28%-32% of the total width W of the steps; a height of the two groups of edge steps is the same as that of the middle step;

when three groups of edge steps are provided, widths of the three groups of edge steps are the same, and a sum of widths of three edge steps on the same side is 28%-32% of the total width W of the steps; and a height of the three groups of edge steps is the same as that of the middle step.

Further, when one group of edge steps are provided, and a width W1 of one edge step is 10%-30% of the total width W of the steps; a ratio of a height H1 of the edge step to a height H2 of the middle step is 1:1-1:2;

when two groups of edge steps are provided, widths of the two groups of edge steps are the same, and a sum of the widths of two edge steps on the same side is 30% of the total width W of the steps; a height of the two groups of edge steps is the same as that of the middle step;

when three groups of edge steps are provided, widths of the three groups of edge steps are the same, and a sum of widths of three edge steps on the same side is 30% of the total width W of the steps; and a height of the three groups of edge steps is the same as that of the middle step.

A piezoelectric device provided by the present invention comprises the tuning fork crystal oscillator plate.

A manufacturing method for a tuning fork crystal oscillator plate provided by the present invention comprises the following steps:

S1: plating metal films on front and back surfaces of a quartz plate interdigital;

S2: performing photolithography and corrosion on a first layer of grooves;

S21: performing front and back surface coating of a photosensitive photoresist material on the quartz plate interdigital plated with the metal films;

S22: performing pattern exposure and development on a position that is of the quartz plate coated with the photosensitive photoresist material and that is correspondingly subject to the photolithography and corrosion of the first layer of grooves to expose a required pattern;

S23: performing metal etching on the exposed area by using an etching solution to expose a surface of the to-be-corroded quartz plate;

S24: stripping and removing the photoresist on the surface of the quartz plate;

S25: corroding by using a corrosive solution to corrode the area exposed by metal etching downwards to corrode out an initial profile morphology of the first layer of grooves;

S3: performing photolithography and corrosion on a second layer of grooves;

S31: performing front and back surface coating of a photosensitive photoresist material on the quartz plate interdigital subjected to the photolithography and corrosion of the first layer of grooves;

S32: performing pattern exposure and development on a position that is of the quartz plate coated with the photosensitive photoresist material and that is correspondingly subject to the photolithography and corrosion on the second layer of grooves to expose a required pattern;

S33: performing metal etching on the exposed area by using an etching solution to expose a surface of the to-be-corroded quartz plate;

S34: stripping and removing the photoresist on the surface of the quartz plate;

S35: corroding a surface of the to-be-corroded quartz plate exposed by the metal etching downwards by using a corrosive solution; wherein in this case, the first layer of groove structure and the second layer of groove structure are both corroded to form a step-shaped sinking groove structure;

when the step-shaped sinking groove has n steps and n is greater than 3, repeating step S3 n−2 times; and S4: removing the metal on the surface of the quartz plate by using an etching solution to obtain the tuning fork crystal oscillator plate.

Further, in the step S1, the metal film is plated by magnetron sputtering or evaporation plating, chromium is used as a bottom layer, the metal film has a thickness of 5-50 nm, and a top layer is made of gold and has a thickness greater than 100 nm.

Further, in the step S23 and the step S33, the performing metal etching on the exposed area by using an etching solution is to perform metal etching by sequentially using a gold etching solution and a chromium etching solution.

Further, in the step S25 and the step S35, when the corrosive solution is used for corrosion, a flow rate of the corrosive solution is 8-20 L/min, a corrosion temperature is 30-90° C., and the corrosion is performed for 15-130 min.

Further, in the step S25 and the step S35, when the corrosion is performed by using the corrosive solution, a flow rate of the corrosive solution is 15-20 L/min, and a corrosion temperature is 50-70° C.

Based on the above technical solutions, the embodiments of the present invention at least can produce the following technical effects:

According to the tuning fork crystal oscillator plate and the manufacturing method therefor provided by the present invention, the manufactured piezoelectric oscillator plate is provided with step-shaped sinking grooves formed by photolithography and corrosion on both front and back surfaces of the vibrating arm, the step-shaped sinking groove is subjected to photolithography and corrosion along a length direction of the vibrating arm, and the step-shaped sinking groove structure not only increases the area of a polarized electric field, but also facilitates the improvement of vibration impedance; in addition, the step-shaped sinking groove is formed by multiple times of photolithography and corrosion, so that the corrosion edges and corners in the X direction caused by one-time corrosion can be improved, the bilateral symmetry of the sinking groove in the X direction can be ensured, the vibration symmetry of two arms of the tuning fork can be improved, the stretching vibration in the X direction can be avoided, and the impedance can be further reduced; and the step-shaped sinking groove can improve the precision of frequency and reduce the energy consumption when being applied to a piezoelectric device.

The piezoelectric device provided by the present invention comprises the tuning fork crystal oscillator plate in the present invention, the manufactured piezoelectric oscillator plate is provided with step-shaped sinking grooves formed by photolithography and corrosion on both front and back surfaces of the vibrating arm, the step-shaped sinking groove is subjected to photolithography and corrosion along a length direction of the vibrating arm, and the step-shaped sinking groove structure not only increases the area of a polarized electric field, but also facilitates the improvement of vibration impedance; in addition, the step-shaped sinking groove is formed by multiple times of photolithography and corrosion, so that the corrosion edges and corners in the X direction caused by one-time corrosion can be improved, the bilateral symmetry of the sinking groove in the X direction can be ensured, the vibration symmetry of two arms of the tuning fork can be improved, the stretching vibration in the X direction can be avoided, and the impedance can be further reduced; and therefore, the piezoelectric device provided by the present invention has the advantages of high frequency accuracy and low energy consumption.

BRIEF DESCRIPTION OF DRAWINGS

In order to more clearly illustrate the technical solutions in the embodiments of the present invention or in the prior art, the drawings required to be used in the description of the embodiments or the prior art are briefly introduced below. It is obvious that the drawings in the description below are some embodiments of the present invention, and those of ordinary skill in the art can obtain other drawings according to the drawings provided herein without creative efforts.

In the drawings.

1: vibrating arm; 2: middle step; 3: edge step; 4: base; 5: step-shaped sinking grooves; 6: electrode.

DETAILED DESCRIPTION OF EMBODIMENTS

In order to make the objectives, technical solutions, and advantages of the present invention clearer, the following describes the technical solutions of the present invention in detail. It is clear that the described embodiments are merely some but not all of embodiments of the present invention. All other embodiments obtained by those of ordinary skill in the art based on embodiments of the present invention without creative efforts shall fall within the protection scope of the present invention.

Embodiment 1: A tuning fork crystal oscillator plate provided by the present invention has a base 4 and a pair of vibrating arms 1 extending out of the base 4, wherein a front surface and a back surface of each vibrating arm 1 are separately provided with step-shaped sinking grooves 5 formed by photolithography and corrosion along a thickness direction, and the photolithography and corrosion are performed on the step-shaped sinking grooves 5 along a length direction of the vibrating arms 1.

the step-shaped sinking groove 5 is provided with n steps, and the n steps are formed by n times of photolithography and corrosion, where n is a natural number and is greater than or equal to 2; and outer surfaces of the step-shaped sinking groove 5 are all plated with electrodes 6.

According to the tuning fork crystal oscillator plate and the manufacturing method therefor provided by the present invention, the manufactured piezoelectric oscillator plate is provided with step-shaped sinking grooves 5 formed by photolithography and corrosion on both front and back surfaces of the vibrating arm 1, the step-shaped sinking groove 5 is subjected to photolithography and corrosion along a length direction of the vibrating arm 1, and the step-shaped sinking groove 5 structure not only increases the area of a polarized electric field, but also facilitates the improvement of vibration impedance; in addition, the step-shaped sinking groove 5 is formed by multiple times of photolithography and corrosion, so that the corrosion edges and corners in the X direction caused by one-time corrosion can be improved, the bilateral symmetry of the sinking groove in the X direction can be ensured, the vibration symmetry of two arms of the tuning fork can be improved, the stretching vibration in the X direction can be avoided, and the impedance can be further reduced; and the step-shaped sinking groove can improve the precision of frequency and reduce the energy consumption when being applied to a piezoelectric device.

In an optional implementation, the step-shaped sinking groove 5 comprises a middle step 2 and at least one group of edge steps 3; the number of the middle steps 2 is one, the number of the edge steps 3 is n−1 groups, and each group of the edge steps 3 are two same steps that are symmetrically arranged on two sides of the middle step 2.

In an optional implementation, the step-shaped sinking groove 5 has one group of edge steps 3, two groups of edge steps 3, or three groups of edge steps 3.

In an optional implementation, when one group of edge steps 3 are provided, a width W1 of any one of the edge steps 3 is 5%-40% of a total width W of the steps; a ratio of a height H1 of any one of the edge steps 3 to a height H2 of the middle step 2 is 1:1-1:3; the total width of the steps is a sum of widths of all the edge steps 3 and a width of the middle step 2;

when two groups of edge steps 3 are provided, widths of the two groups of edge steps 3 are the same, and a sum of widths of two edge steps 3 on the same side is 28%-32% of the total width W of the steps; a height of the two groups of edge steps 3 is the same as that of the middle step 2; when three groups of edge steps 3 are provided, widths of the three groups of edge steps 3 are the same, and a sum of widths of three edge steps 3 on the same side is 28%-32% of the total width W of the steps; and a height of the three groups of edge steps 3 is the same as that of the middle step 2.

In an optional implementation, when one group of edge steps 3 are provided, and a width W1 of one edge step 3 is 10%-30% of the total width W of the steps; a ratio of a height H1 of the edge step 3 to a height H2 of the middle step 2 is 1:1-1:2;

when two groups of edge steps 3 are provided, widths of the two groups of edge steps 3 are the same, and a sum of the widths of two edge steps 3 on the same side is 30% of the total width W of the steps; a height of the two groups of edge steps 3 is the same as that of the middle step 2;

when three groups of edge steps 3 are provided, widths of the three groups of edge steps 3 are the same, and a sum of widths of three edge steps 3 on the same side is 30% of the total width W of the steps; and a height of the three groups of edge steps 3 is the same as that of the middle step 2.

Embodiment 2: A piezoelectric device provided by the present invention comprises the tuning fork crystal oscillator plate.

The piezoelectric device provided by the present invention comprises the tuning fork crystal oscillator plate in the present invention, the manufactured piezoelectric oscillator plate is provided with step-shaped sinking grooves 5 formed by photolithography and corrosion on both front and back surfaces of the vibrating arm 1, the step-shaped sinking groove 5 is subjected to photolithography and corrosion along a length direction of the vibrating arm 1, and the step-shaped sinking groove 5 structure not only increases the area of a polarized electric field, but also facilitates the improvement of vibration impedance; in addition, the step-shaped sinking groove 5 is formed by multiple times of photolithography and corrosion, so that the corrosion edges and corners in the X direction caused by one-time corrosion can be improved, the bilateral symmetry of the sinking groove in the X direction can be ensured, the vibration symmetry of two arms of the tuning fork can be improved, the stretching vibration in the X direction can be avoided, and the impedance can be further reduced; and therefore, the piezoelectric device provided by the present invention has the advantages of high frequency accuracy and low energy consumption.

Figure 15:
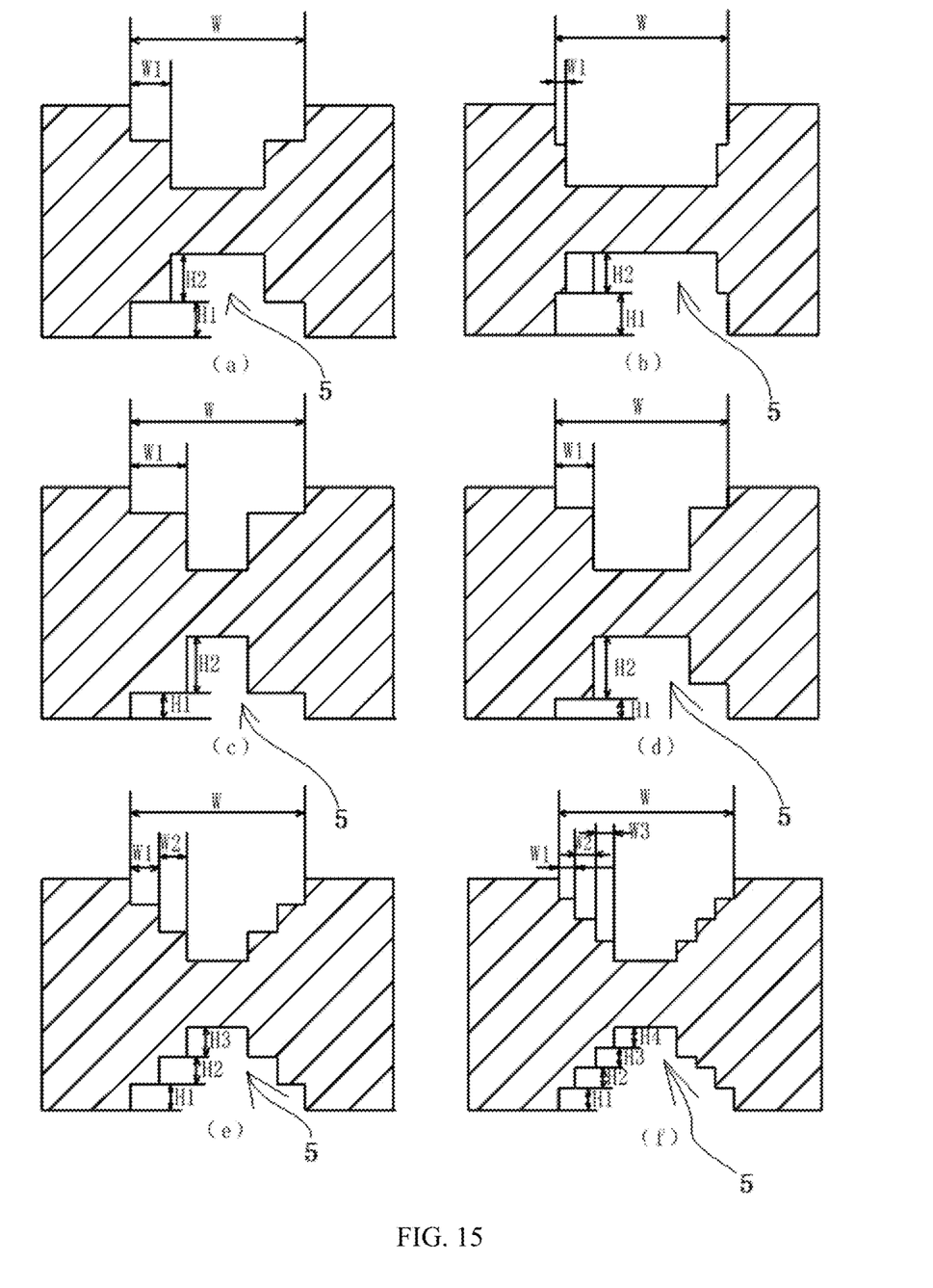
FIG. 15 is a cross-sectional view of a single vibrating arm in Embodiments 3 to 8 of the present invention.

Embodiment 3: The tuning fork crystal oscillator plate is manufactured by taking FIG. 8 as a design diagram, wherein the step-shaped sinking groove 5 has a structure as shown in FIG. 15(a), one group of edge steps 3 are provided, and a width W1 of one edge step 3 is 20% of the total width W of the steps; a ratio of a height H1 of the edge step 3 to a height H2 of the middle step 2 is 1:1.5; and the manufacturing method for the tuning fork crystal oscillator plate specifically comprises the following steps:

S1: plating metal films on front and back surfaces of a quartz plate interdigital;

S2: performing photolithography and corrosion on a first layer of grooves;

S21: performing front and back surface coating of a photosensitive photoresist material on the quartz plate interdigital plated with the metal films;

S22: performing pattern exposure and development on a position that is of the quartz plate coated with the photosensitive photoresist material and that is correspondingly subject to the photolithography and corrosion of the first layer of grooves to expose a required pattern;

S23: performing metal etching on the exposed area by using the gold etching solution and chromium etching solution to expose a surface of the to-be-corroded quartz plate;

S24: stripping and removing the photoresist on the surface of the quartz plate;

S25: corroding by using a corrosive solution to corrode the area exposed by metal etching downwards, wherein when the corrosive solution is used for corrosion, a flow rate of the corrosive solution is 18 L/min, a corrosion temperature is 60° C., and the corrosion is performed for 60 min; corroding out an initial profile morphology of the first layer of grooves;

S3: performing photolithography and corrosion on a second layer of grooves;

S31: performing front and back surface coating of a photosensitive photoresist material on the quartz plate interdigital subjected to the photolithography and corrosion of the first layer of grooves;

S32: performing pattern exposure and development on a position that is of the quartz plate coated with the photosensitive photoresist material and that is correspondingly subject to the photolithography and corrosion on the second layer of grooves to expose a required pattern;

S33: performing metal etching on the exposed area by using the gold etching solution and chromium etching solution to expose a surface of the to-be-corroded quartz plate;

S34: stripping and removing the photoresist on the surface of the quartz plate;

S35: corroding a surface of the to-be-corroded quartz plate exposed by the metal etching downwards by using a corrosive solution; wherein when the corrosive solution is used for corrosion, a flow rate of the corrosive solution is 18 L/min, a corrosion temperature is 60° C., and the corrosion is performed for 90 min, and in this case, the first layer of groove structure and the second layer of groove structure are both corroded to form a step-shaped sinking groove 5 structure;

when the step-shaped sinking groove 5 has n steps and n is greater than 3, repeating step S3 n times; and S4: removing the metal on the surface of the quartz plate by using an etching solution to obtain the tuning fork crystal oscillator plate.

Figure 1:
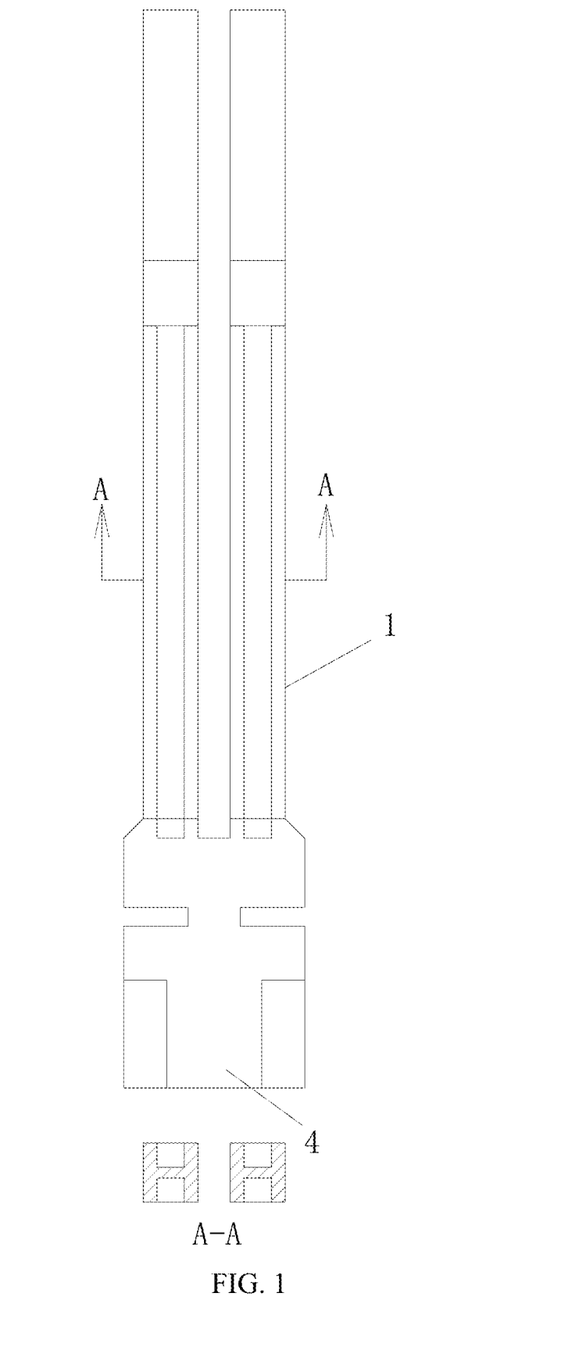
FIG. 1 is a design diagram of a tuning fork crystal oscillator plate (where electrodes are not shown) in the conventional technology.
Figure 8:
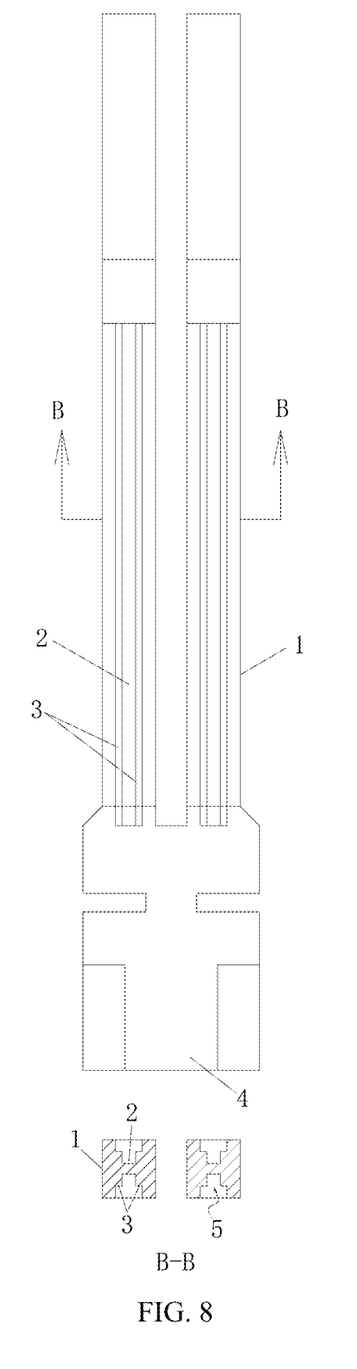
FIG. 8 is a design diagram of a tuning fork crystal oscillator plate according to Embodiment 3 of the present invention.
Figure 9:
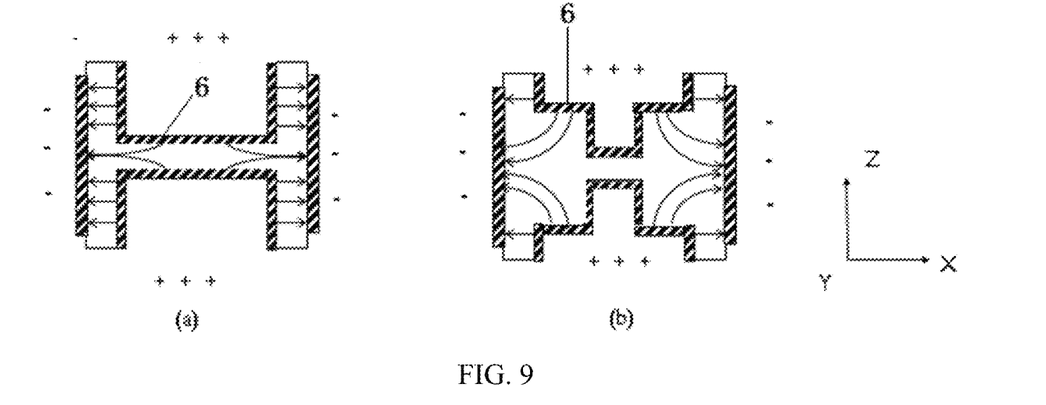
FIG. 9 is a comparison diagram of the electric field distribution between the design diagram in Embodiment 3 of the present invention and the design diagram of the tuning fork crystal oscillator plate in the conventional technology.

Finite element analysis calculations are performed on the tuning fork crystal oscillator plates manufactured in Embodiment 3:

FIG. 9 is a schematic diagram of the electric field distribution, where FIG. 9(a) is a schematic diagram of the electric field distribution of the structure shown in FIG. 1, and FIG. 9(b) is a schematic diagram of the electric field distribution of the structure shown in FIG. 8.

Figure 10:
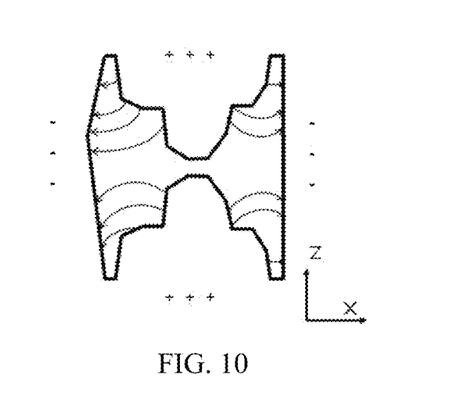
FIG. 10 is a cross-sectional structural diagram and an electric field distribution diagram of a vibrating arm of a tuning fork crystal oscillator plate manufactured in Embodiment 3 of the present invention.

FIG. 10 shows a schematic diagram of a cross-sectional structure and an electric field distribution diagram of the vibrating arm 1 of the tuning fork quartz crystal oscillator plate obtained in Embodiment 3; it can be observed from FIG. 10 that the bilateral symmetry of the corrosion groove has been greatly improved compared to that of FIG. 2, and the symmetry along the X direction can be ensured.

Figure 11:
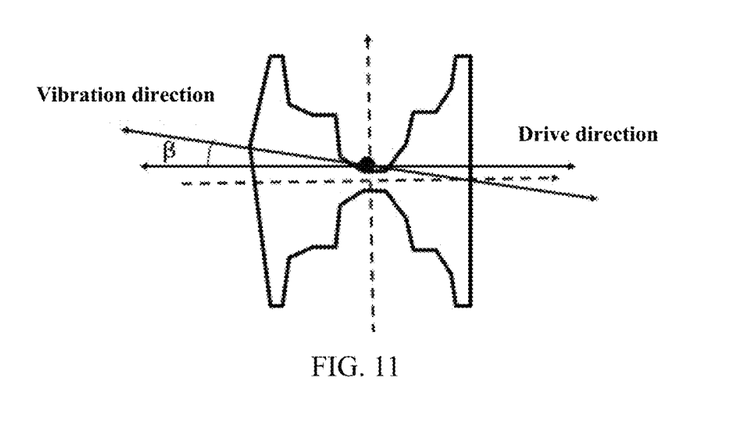
FIG. 11 is a force analysis diagram of the vibrating arm of the tuning fork crystal oscillator plate manufactured in Embodiment 3 of the present invention.

FIG. 11 shows stress and vibration analysis for the structure in Embodiment 3; as shown in FIG. 11, under the driving action of the electric field μl (an X-direction electric field), the deflection angle β of the stress T2 in the vibration direction becomes very small, and the stress T1 in the X-direction also tends to be symmetrical and does not generate the stretching vibration shown in FIG. 7.

Figure 12:
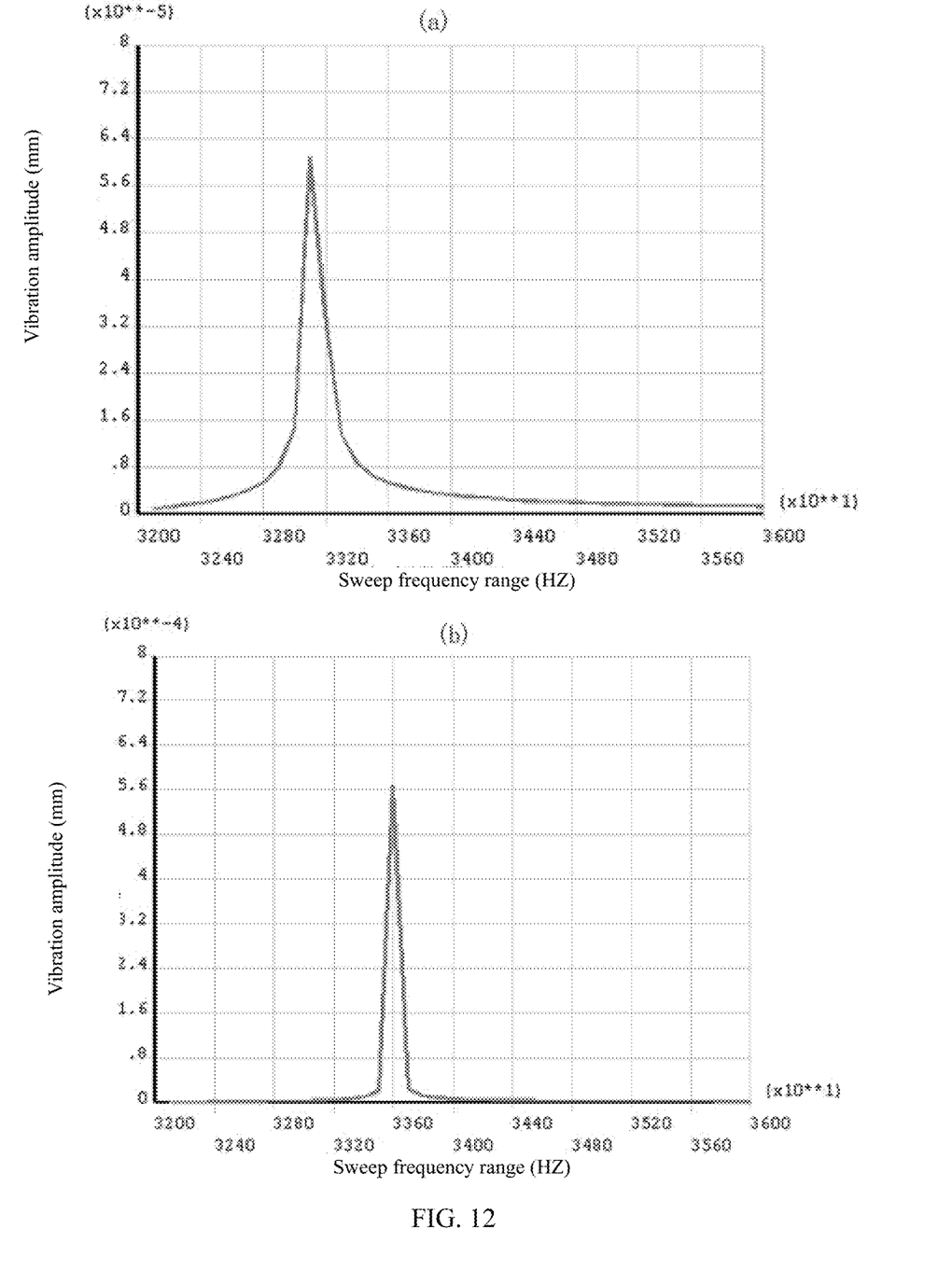
FIG. 12 is a comparison diagram of the displacement distributions of the tuning fork crystal oscillator plate in Embodiment 3 of the present invention and the conventional technology.

FIG. 12 is a comparison diagram of the displacement distribution, where FIG. 12(a) is the displacement distribution diagram for the structure shown in FIG. 2, and FIG. 12(b) is the displacement distribution diagram for the structure shown in FIG. 9; it can be observed from the finite element analysis calculation results for FIG. 12(a) that the vibration displacement of the rectangular groove in the X direction in the FIG. 12(a) is 5.8e-5 mm, and the vibration displacement of the stepped sinking groove in the FIG. 12(b) is 5.6e-4 mm, so that the vibration displacement is significantly increased by one order of magnitude, which indicates that the vibration impedance is reduced.

Figure 13:
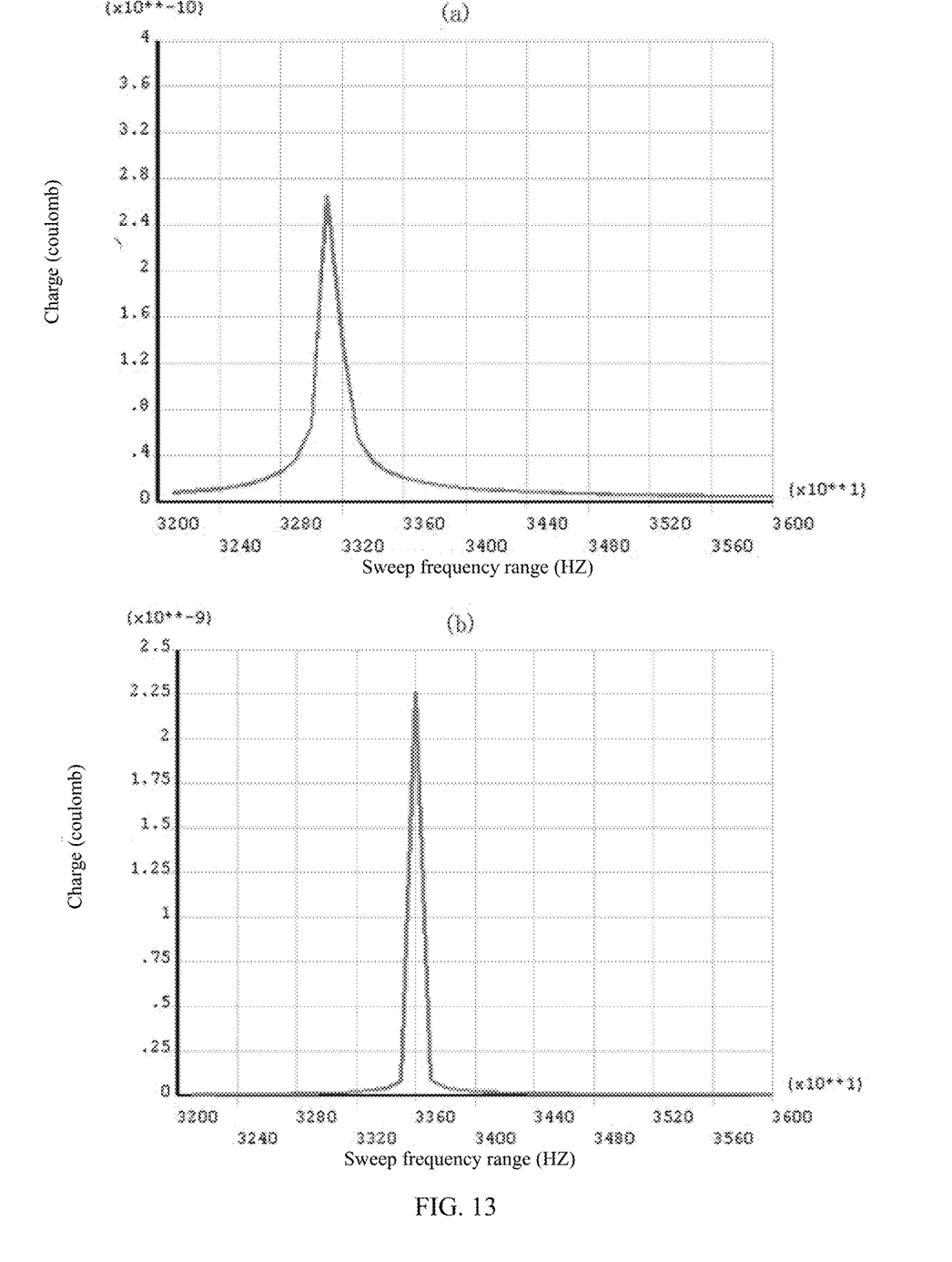
FIG. 13 is a comparison diagram of the charge distributions of the tuning fork crystal oscillator plate in Embodiment 3 of the present invention and the conventional technology.
Figure 14:
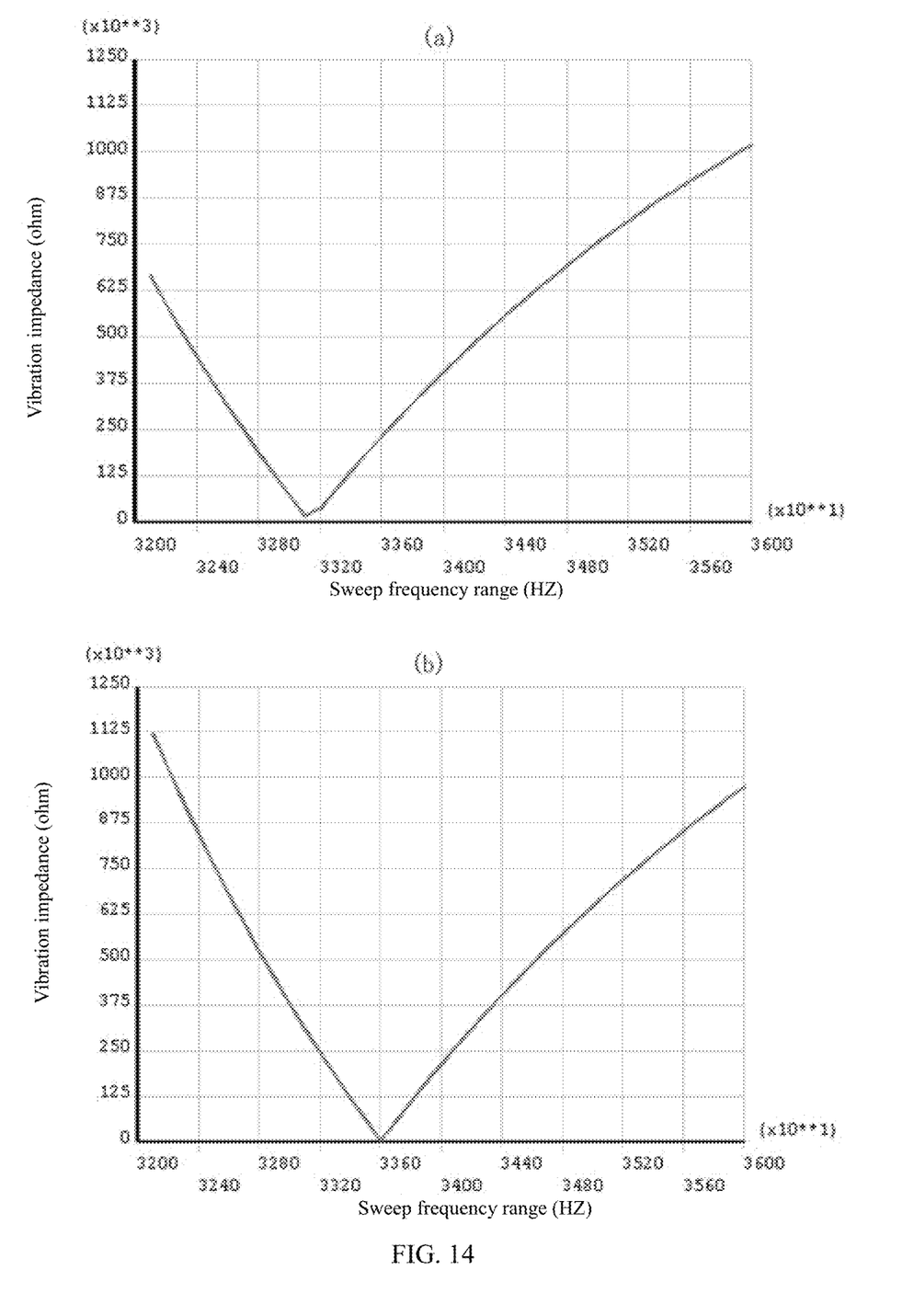
FIG. 14 is a comparison diagram of the impedance analysis of the tuning fork crystal oscillator plate in Embodiment 3 of the present invention and the conventional technology.

FIG. 13 is a comparison diagram of the charge distributions, where FIG. 13(a) is the charge distribution diagram for the structure shown in FIG. 2, and FIG. 13(b) is the charge distribution diagram for the structure shown in FIG. 10; FIG. 14 is a comparison diagram of the impedance analysis, where FIG. 14(a) is an impedance analysis diagram of the structure shown in FIG. 2, and FIG. 14(b) is an impedance analysis diagram of the structure shown in FIG. 10; the magnitude of the impedance can be seen by the charge distribution diagram of FIG. 13 and the impedance analysis diagram of FIG. 14, where the impedance of the structure shown in FIG. 2 is 35 KΩ, while the impedance of the structure shown in FIG. 9 is 18.6 KΩ, and the overall impedance is reduced by half. Therefore, the stepped sinking groove is very beneficial to the vibration impedance of the tuning fork by increasing the polarization area of an electric field and the symmetrical corrosion groove.

Embodiment 4: The step-shaped sinking groove 5 has a structure as shown in FIG. 15(b), one group of edge steps 3 are provided, and a width W1 of one edge step 3 is 5% of the total width W of the steps; a ratio of a height H1 of the edge step 3 to a height H2 of the middle step 2 is 1:1; and the manufacturing steps are the same as those in Embodiment 3;

this embodiment differs from Embodiment 3 in that: the specific corrosion parameters (flow rate of corrosive solution, corrosion temperature, and corrosion time) in this embodiment are shown in Table 1 below; and the tuning fork crystal oscillator plate is obtained.

Embodiment 5: The step-shaped sinking groove 5 has a structure as shown in FIG. 15(c), one group of edge steps 3 are provided, and a width W1 of one edge step 3 is 30% of the total width W of the steps; a ratio of a height H1 of the edge step 3 to a height H2 of the middle step 2 is 1:2; and the manufacturing steps are the same as those in Embodiment 3;

this embodiment differs from Embodiment 3 in that: the specific corrosion parameters (flow rate of corrosive solution, corrosion temperature, and corrosion time) in this embodiment are shown in Table 1 below; and the tuning fork crystal oscillator plate is obtained.

Embodiment 6: The step-shaped sinking groove 5 has a structure as shown in FIG. 15(d), one group of edge steps 3 are provided, and a width W1 of one edge step 3 is 30% of the total width W of the steps; a ratio of a height H1 of the edge step 3 to a height H2 of the middle step 2 is 1:3; and the manufacturing steps are the same as those in Embodiment 3;

this embodiment differs from Embodiment 3 in that: the specific corrosion parameters (flow rate of corrosive solution, corrosion temperature, and corrosion time) in this embodiment are shown in Table 1 below; and the tuning fork crystal oscillator plate is obtained.

Embodiment 7: The step-shaped sinking groove 5 has a structure as shown in FIG. 15(e), two groups of edge steps 3 are provided, the width W1 of the edge step 3 is equal to W2, and the sum of W1 and W2 is 20% of the total width W of the steps; the height H1 of the edge step 3 is equal to H2, and the height H3 of the middle step 2 is equal to H1; and the manufacturing steps are the same as those in Embodiment 3;

this embodiment differs from Embodiment 3 in that: since three groups of edge steps 3 are provided, the step S3 is required to be repeated once again to perform photolithography and corrosion on the third layer of grooves, and the specific corrosion parameters (flow rate of corrosive solution, corrosion temperature, and corrosion time) in this embodiment are shown in Table 1 below; and the tuning fork crystal oscillator plate is obtained.

Embodiment 8: The step-shaped sinking groove 5 has a structure as shown in FIG. 15(f), three groups of edge steps 3 are provided, the width W1 of the edge step 3 is equal to W2 and W3, and the sum of W1, W2 and W3 is 30% of the total width W of the steps; the height H1 of the edge step 3 is equal to H2 and H3, and the height H4 of the middle step 2 is equal to H1; and the manufacturing steps are the same as those in Embodiment 3;

this embodiment differs from Embodiment 3 in that: since three groups of edge steps 3 are provided, the step S3 is required to be repeated twice again to perform photolithography and corrosion on the third layer of grooves and the fourth layer of grooves, and the specific corrosion parameters (flow rate of corrosive solution, corrosion temperature, and corrosion time) in this embodiment are shown in Table 1 below; and the tuning fork crystal oscillator plate is obtained.

In the Embodiment 3 to Embodiment 8 and the conventional technology shown in FIG. 1:

(1) the total width W of the steps is the same and is the same as the width of the groove in the conventional technology; and
(2) the total depth of the steps (i.e., the depth of the middle steps) is the same and is the same as the depth of the groove in the conventional technology.

The vibration impedance of the tuning fork crystal oscillator plates in Embodiments 3 to 8 and in the conventional technology is calculated by using finite element analysis, and the results are shown in the following Table 1:

TABLE 1

Impedance calculation results for the oscillator plates in Embodiments 3 to 8 and in the conventional technology

|  | Embodiments | Design parameters | Corrosion parameters (flow rate of corrosive solution, corrosion temperature, corrosion time) | | | | Impedance, kΩ |
|---|---|---|---|---|---|---|---|
|  |  |  | First layer of grooves | Second layer of grooves | Third layer of grooves | Fourth layer of grooves |  |
| One group of edge steps | Embodiment 3 | $W1 = 20\%*W$<br>$H1:H2 = 1:1.5$ | The flow rate is 18 L/min<br>The temperature is 60° C.<br>The time is 60 min | The flow rate is 18 L/min<br>The temperature is 60° C.<br>The time is 90 min |  |  | 18.6 |
|  | Embodiment 4 | $W1 = 5\%*W$<br>$H1:H2 = 1:1$ | The flow rate is 18 L/min<br>The temperature is 60° C.<br>The time is 80 min | The flow rate is 18 L/min<br>The temperature is 60° C.<br>The time is 80 min |  |  | 30 |
|  | Embodiment 5 | $W1 = 30\%*W$<br>$H1:H2 = 1:2$ | The flow rate is 20 L/min<br>The temperature is 60° C.<br>The time is 50 min | The flow rate is 20 L/min<br>The temperature is 60° C.<br>The time is 100 min |  |  | 28 |
|  | Embodiment 6 | $W1 = 40\%*W$<br>$H1:H2 = 1:3$ | The flow rate is 15 L/min<br>The temperature is 70° C.<br>The time is 40 min | The flow rate is 15 L/min<br>The temperature is 70° C.<br>The time is 120 min |  |  | 31 |
| Two groups of edge steps | Embodiment 7 | $W1 = W2,$<br>$W1 + W2 = 30\%*W$<br>$H1 = H2 = H3$ | The flow rate is 15 L/min<br>The temperature is 60° C.<br>The time is 50 min | The flow rate is 15 L/min<br>The temperature is 60° C.<br>The time is 50 min | The flow rate is 15 L/min<br>The temperature is 60° C.<br>The time is 50 min |  | 25 |
| Three groups of edge steps | Embodiment 8 | $W1 = W2 = W3,$<br>$W1 + W2 + W3 = 30\%*W$<br>$H1 = H2 = H3 = H4$ | The flow rate is 15 L/min<br>The temperature is 60° C.<br>The time is 40 min | The flow rate is 15 L/min<br>The temperature is 60° C.<br>The time is 40 min | The flow rate is 15 L/min<br>The temperature is 60° C.<br>The time is 40 min | The flow rate is 15 L/min<br>The temperature is 60° C.<br>The time is 40 min | 18.5 |
|  | One groove | Structure shown in FIG. 1 (conventional technology) | The flow rate is 15 L/min<br>The temperature is 60° C.<br>The time is 160 min |  |  |  | 35 |

It can be seen from Table 1 that the vibration impedance of the tuning fork crystal oscillator plate manufactured in the present invention is significantly lower than that of the tuning fork crystal oscillator plate in the conventional technology, and especially, in Embodiment 3, Embodiment 7 and Embodiment 8, the vibration impedance has a large reduction range, which has significant advantages, and when the tuning fork crystal oscillator plate is applied to a piezoelectric device, the frequency accuracy can be greatly improved and the energy consumption can be greatly reduced.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention.

What is claimed is:

1. A tuning fork crystal oscillator plate, having a base and a pair of vibrating arms extending out of the base, wherein a front surface and a back surface of each vibrating arm are separately provided with step-shaped sinking grooves formed by photolithography and corrosion along a thickness direction, and the photolithography and corrosion are performed on the step-shaped sinking grooves along a length direction of the vibrating arms;
the step-shaped sinking groove is provided with n steps, and the n steps are formed by n times of photolithography and corrosion, where n is a natural number and is greater than or equal to 2;
outer surfaces of the step-shaped sinking groove are all plated with electrodes;
the step-shaped sinking groove comprises a middle step and at least one group of edge steps; the number of the middle steps is one, the number of the edge steps is n−1 groups, and each group of the edge steps are two same steps that are symmetrically arranged on two sides of the middle step;

when one group of edge steps are provided, a width W1 of any one of the edge steps is 5%-40% of a total width W of the steps; the total width of the steps is a sum of widths of all the edge steps and a width of the middle step; a ratio of a height H1 of any one of the edge steps to a height H2 of the middle step is 1:1-1:3;

when two groups of edge steps are provided, widths of the two groups of edge steps are the same, and a sum of widths of two edge steps on the same side is 28%-32% of the total width W of the steps;

a height of the two groups of edge steps is the same as that of the middle step;

when three groups of edge steps are provided, widths of the three groups of edge steps are the same, and a sum of widths of three edge steps on the same side is 28%-32% of the total width W of the steps; and a height of the three groups of edge steps is the same as that of the middle step.

2. The tuning fork crystal oscillator plate according to claim 1, wherein the step-shaped sinking groove has one group of edge steps, two groups of edge steps, or three groups of edge steps.

3. The tuning fork crystal oscillator plate according to claim 1, wherein when one group of edge steps are provided, and a width W1 of one edge step is 10%-30% of the total width W of the steps;

a ratio of a height H1 of the edge step to a height H2 of the middle step is 1:1-1:2;

when two groups of edge steps are provided, widths of the two groups of edge steps are the same, and a sum of widths of two edge steps on the same side is 30% of the total width W of the steps; a height of the two groups of edge steps is the same as that of the middle step;

when three groups of edge steps are provided, widths of the three groups of edge steps are the same, and a sum of widths of three edge steps on the same side is 30% of the total width W of the steps;

and a height of the three groups of edge steps is the same as that of the middle step.

4. A piezoelectric device, comprising the tuning fork crystal oscillator plate according to claim 1.

5. A manufacturing method for the tuning fork crystal oscillator plate according to claim 1, comprising the following steps:

S1: plating metal films on front and back surfaces of a quartz plate interdigital;

S2: performing photolithography and corrosion on a first layer of grooves;

S21: performing front and back surface coating of a photosensitive photoresist material on the quartz plate interdigital plated with the metal films;

S22: performing pattern exposure and development on a position that is of the quartz plate coated with the photosensitive photoresist material and that is correspondingly subject to the photolithography and corrosion of the first layer of grooves to expose a required pattern;

S23: performing metal etching on the exposed area by using an etching solution to expose a surface of the to-be-corroded quartz plate;

S24: stripping and removing the photoresist on the surface of the quartz plate;

S25: corroding by using a corrosive solution to corrode the area exposed by metal etching downwards to corrode out an initial profile morphology of the first layer of grooves;

S3: performing photolithography and corrosion on a second layer of grooves;

S31: performing front and back surface coating of a photosensitive photoresist material on the quartz plate interdigital subjected to the photolithography and corrosion of the first layer of grooves;

S32: performing pattern exposure and development on a position that is of the quartz plate coated with the photosensitive photoresist material and that is correspondingly subject to the photolithography and corrosion on the second layer of grooves to expose a required pattern;

S33: performing metal etching on the exposed area by using an etching solution to expose a surface of the to-be-corroded quartz plate;

S34: stripping and removing the photoresist on the surface of the quartz plate;

S35: corroding a surface of the to-be-corroded quartz plate exposed by the metal etching downwards by using a corrosive solution; wherein in this case, the first layer of groove structure and the second layer of groove structure are both corroded to form a step-shaped sinking groove structure;

when the step-shaped sinking groove has n steps and n is greater than 3, repeating step S3 n−2 times; and S4: removing the metal on the surface of the quartz plate by using an etching solution to obtain the tuning fork crystal oscillator plate.

6. The manufacturing method for the tuning fork crystal oscillator plate according to claim 5, wherein in the step S1, the metal film is plated by magnetron sputtering or evaporation plating, chromium is used as a bottom layer, the metal film has a thickness of 5-50 nm, and a top layer is made of gold and has a thickness greater than 100 nm; and in the step S23 and the step S33, the performing metal etching on the exposed area by using an etching solution is to perform metal etching by sequentially using a gold etching solution and a chromium etching solution.

7. The manufacturing method for the tuning fork crystal oscillator plate according to claim 5, wherein in the step S25 and the step S35, when the corrosive solution is used for corrosion, a flow rate of the corrosive solution is 8-20 L/min, a corrosion temperature is 30-90° C., and the corrosion is performed for 15-130 min.

8. The manufacturing method for the tuning fork crystal oscillator plate according to claim 5, wherein in the step S25 and the step S35, when the corrosion is performed by using the corrosive solution, a flow rate of the corrosive solution is 15-20 L/min, and a corrosion temperature is 50-70° C.

* * * * *